(12) United States Patent
Akasegawa et al.

(10) Patent No.: US 6,690,957 B2
(45) Date of Patent: Feb. 10, 2004

(54) HIGH TEMPERATURE SUPERCONDUCTOR FILM, METHOD FOR FORMING THE SAME AND SUPERCONDUCTOR ELEMENT

(75) Inventors: Akihiko Akasegawa, Kawasaki (JP); Kazunori Yamanaka, Kawasaki (JP); Teru Nakanishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 84 days.

(21) Appl. No.: 10/101,173

(22) Filed: Mar. 20, 2002

(65) Prior Publication Data

US 2003/0073584 A1 Apr. 17, 2003

(30) Foreign Application Priority Data

Oct. 12, 2001 (JP) .......................... 2001-315681

(51) Int. Cl.[7] .................. H01B 12/00; H01F 6/00; H01L 39/00; H01L 39/24
(52) U.S. Cl. ................ 505/230; 505/125; 505/434; 505/473; 505/475
(58) Field of Search ................ 505/125, 126, 505/230, 235, 233, 234, 236, 237, 238, 430, 434, 470, 473, 475, 501

(56) References Cited

U.S. PATENT DOCUMENTS

| | | | | |
|---|---|---|---|---|
| 6,136,756 | A | * | 10/2000 | Langbein et al. ........... 505/450 |
| 6,191,074 | B1 | * | 2/2001 | Ravi-Chandar et al. ...... 505/430 |
| 6,300,284 | B1 | * | 10/2001 | Ihara et al. ................ 505/125 |
| 6,365,554 | B1 | * | 4/2002 | Thompson et al. ......... 505/434 |
| 6,436,317 | B1 | * | 8/2002 | Malozemoff et al. .... 252/519.1 |
| 6,569,811 | B1 | * | 5/2003 | Shi ........................... 505/400 |
| 6,602,588 | B1 | * | 8/2003 | Kwon et al. ................ 428/216 |

FOREIGN PATENT DOCUMENTS

| | | |
|---|---|---|
| JP | 04-214009 | 8/1992 |
| JP | 06-219897 | 8/1994 |
| JP | 06-305891 | 11/1994 |
| JP | 08-2452298 | 9/1996 |

* cited by examiner

Primary Examiner—Kiley Stoner
Assistant Examiner—Colleen P. Cooke
(74) Attorney, Agent, or Firm—Armstrong, Kratz, Quintos, Hanson & Brooks, LLP

(57) ABSTRACT

A high temperature superconductor film which is Y—Ba—Cu—O-based and formed on a dielectric substrate 10, and has a Cu composition ratio to the Ba near the upper surface of the film which is higher than a Cu composition ratio to the Ba inside the film. The YBCO-based high temperature superconductor film is formed with a Cu composition on the film surface maintained higher with respect to the stoichiometric composition, whereby the Cu oxide can be easily produced while the production of the yttrium oxides can be depressed. The yttrium oxides cannot be easily produced, which makes it difficult for pores and crystal strains to be generated while the Cu oxide functions as a flux for advancing the crystal growth, whereby the YBCO-based high temperature superconductor film can have good film quality and single crystal. The superconducting elements can be formed of the YBCO-based high temperature superconducting film of such good film quality.

25 Claims, 6 Drawing Sheets

HIGH TEMPERATURE SUPERCONDUCTOR FILM, METHOD FOR FORMING THE SAME AND SUPERCONDUCTOR ELEMENT

CROSS-REFERENCE TO RELATED APPLICATIONS

This application is based upon and claims priority of Japanese Patent Application No. 2001-315681 filed in Oct. 12, 2001, the contents being incorporated herein by reference.

BACKGROUND OF THE INVENTION

The present invention relates to a high temperature superconductor film and a method for forming the same, and a superconductor element using the high temperature superconductor film, more specifically to a Y—Ba—Cu—O-based high temperature superconductor film and a method for forming the same, and a superconductor element using the high temperature superconductor film.

It is known that oxide high temperature superconductor has much lower surface resistances at high frequencies in comparison with electric conductors, such as copper, etc. For example, Y—Ba—Cu—O-based high temperature superconductor film (hereinafter called also "YBCO-based high temperature superconductor film") can have surface resistances at, e.g., 2 GHz, which is lower by above two-digits than copper.

In view of this, it is expected to use the YBCO-based high temperature superconductor film as a circuit pattern to thereby provide a superconducting filter having a small insertion loss, a sharp frequency cut-off characteristics and a high unloaded Q. An unloaded Q value means an inverse number of a loss.

A superconducting filter having a small insertion loss, sharp frequency cut-off characteristics and a high unloaded Q is used in communication apparatuses and equipmenets of base stations of mobile communication, whereby the efficiency of using frequencies can be improved (Reference: Toshio NOJIMA and Kei SATOH, OYO BUTURI (Applied Physics), Vol.70, No.1, p.28–32 (2001)).

A method for forming the conventional YBCO-based high temperature superconductor film will be explained with reference to FIG. 6. FIG. 6A is a sectional view of the conventional YBCO-based high temperature superconductor film (Part 1). FIG. 6B is a sectional view of the conventional YBCO-based high temperature superconductor film (Part 2).

First, a dielectric substrate 110 of, e.g., MgO single crystal is placed in a film forming chamber of a pulsed laser deposition (PLD) system.

Then, a YBCO-based high temperature superconductor film 112 is grown on the entire surface of the dielectric substrate 110 by pulsed laser deposition. As a target is used a target of a composition which is as approximate to a stoichiometric composition (Y:Ba:Cu=1:2:3) of the YBCO-based high temperature superconductor film as possible, specifically to a sintered body of, e.g., $Y_1Ba_2Cu_3O_x$.

The thus-grown YBCO-based high temperature superconductor film 112 is oriented in the direction of c axis with respect to the plane of the dielectric substrate 110, i.e., the YBCO-based high temperature superconductor film 112 is oriented in the longitudinal axis of the lattice.

However, the conventional YBCO-based high temperature superconductor film 112 does not have good quality. That is, the conventional YBOC-based high temperature superconductor film 112 shown in FIG. 6A has crystal defects (crystal dislocations) 113, crystal strains (not shown), etc. caused in the film. The conventional YBCO-based high temperature superconductor film 112 shown in FIG. 6B has yttrium oxides 115, such as $Y_2O_3$, $Y_2Ba_1Cu_1O_5$, etc. produced in the film. Pores 117 are generated near the yttrium oxides 115.

A circuit pattern of a superconducting filter is formed by patterning a high temperature superconductor film in a required configuration. Accordingly, when the high temperature superconductor film 112 as shown in FIG. 6 is patterned to form a circuit pattern, the crystal defects 113, and concavities and convexities are exposed on the side surfaces of the circuit pattern, or non-superconducting phases, as of yttrium oxides 112, etc., are exposed on the side surfaces of the circuit pattern. In the circuit patterns of filters formed of high temperature superconductor films, high-frequency signals tend to propagate along the side surfaces of the circuit patterns. Accordingly, when the circuit pattern has the crystal defects 113, and concavities and convexities exposed on the side surfaces, or non-super conducting phases, as of yttrium oxides 112, etc., exposed on the side surfaces, surface resistances at high frequencies are high.

Thus, when a circuit pattern is formed of the conventional YBCO-based high temperature superconductor film 112 as shown in FIGS. 6A and 6B, it is difficult to make a superconducting filter having a small insertion loss, sharp frequency cut-off characteristics and high unloaded Q.

SUMMARY OF THE INVENTION

An object of the present invention is to provide a YBCO-based high temperature superconductor film of good film quality and a method for forming the same, and a superconductor element using the YBCO-based high temperature superconductor film and having good electric characteristics.

According to one aspect of the present invention, there is provided a high temperature superconductor film which is Y—Ba—Cu—O-based and formed on a dielectric substrate, a Cu composition ratio to the Ba near the upper surface of the film being higher than a composition Cu ratio to the Ba inside the film.

According to another aspect of the present invention, there is provided a method for forming a high temperature superconductor film comprising the step of growing a Y—Ba—Cu—O-based high temperature superconductor film on a dielectric substrate, in the step of growing the high temperature superconducting film, the high temperature superconductor film is grown with a Cu composition ratio to the Ba near the upper surface of the film kept higher with respect to a Cu composition ratio to the Ba inside the film.

According to farther another aspect of the present invention, there is provided a superconductor element comprising a Y—Ba—Cu—O-based high temperature superconductor film, a Cu composition ratio to the Ba near the upper surface of the film is higher than a Cu composition ratio with respect to the Ba inside the film.

As described above, according to the present invention, the YBCO-based high temperature superconductor film is formed with a Cu composition on the film surface maintained higher with respect to the stoichiometric composition, whereby the Cu oxide can be easily produced while the production of the yttrium oxides can be depressed. According to the present invention, the yttrium oxides cannot be easily produced, which makes it difficult for pores and crystal strains to be generated while the Cu oxide functions as a flux for advancing the crystal growth, whereby the YBCO-based high temperature superconductor film can have good film quality and single crystal. According to the present invention, the superconducting elements can be formed of the YBCO-based high temperature superconducting film of such good film quality.

DETAILED DESCRIPTION OF THE INVENTION

[Principle of the Present Invention]

Figure 1:
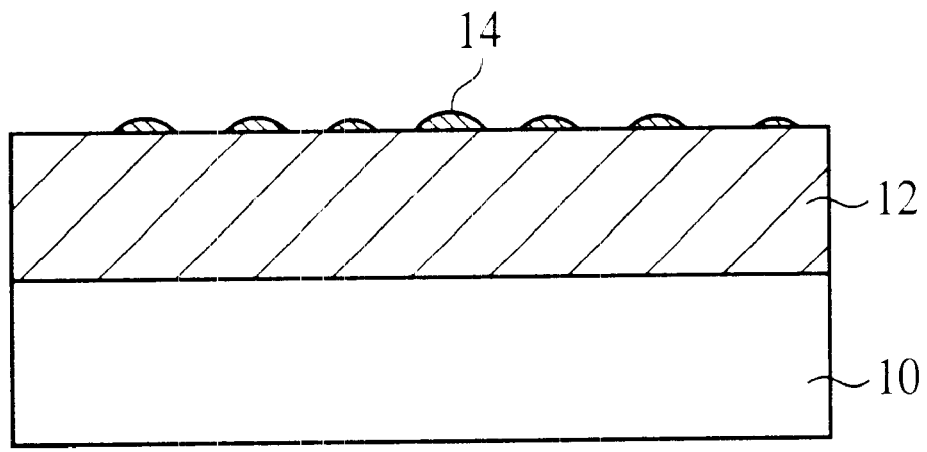
FIG. 1 is a sectional view of the YBCO-based high temperature superconductor film according to a first embodiment of the present invention.

In growing a YBCO-based high temperature superconductor film on a dielectric substrate by pulsed laser deposition, sputtering, etc., yttrium oxides, such as $Y_2O_3$, $Y_2Ba_1Cu_1O_5$, etc., and Cu oxides, such as CuO, $BaCO_2$, etc., are produced in the growing process of the YBCO-based high temperature superconductor film.

The yttrium oxides characteristically tend to remain in the film of the YBCO high temperature superconductor film. Growing rates of the yttrium oxides are lower than those of YBCO crystals. Accordingly, when the yttrium oxides grow while the YBCO-based high temperature superconductor film is growing, pores, etc. are produced above parts where the yttrium oxides have been produced. When the yttrium oxides are produced while the YBCO-based high temperature superconductor film is growing, it is difficult for the YBCO-based high temperature superconductor film to have good film quality.

On the other hand, the Cu oxides characteristically do not easily remain in the film of the YBCO-based high temperature superconductor film while the YBCO-based high temperature superconductor film is growing, and the Cu oxides are characteristically deposited on the surface of the YBCO-based high temperature superconductor film. Even when the Cu oxides are produced in the YBCO-based high temperature superconductor film while the film is growing, the production of the Cu oxides causes no pore and crystal strain. The Cu oxides rather act to advance the crystal growth of the YBCO-based high temperature superconductor film.

The inventors of the present application made earnest studies and have had an idea that the YBCO-based high temperature superconductor film is grown with a Cu composition near the surface of the film maintained higher with respect to a stoichiometric composition. The YBCO-based high temperature superconductor film is grown with a Cu composition near the surface of the film maintained higher with respect to a stoichiometric composition, whereby the Cu oxides can be easily produced while the yttrium oxides cannot be easily produced. The Cu oxides act as a flux for advancing the crystal growth of the YBCO-based high temperature superconductor film as described above, which can contribute to forming a YBCO-based high temperature superconductor film of substantially single crystal free from crystal defects and strains. Furthermore, the Cu oxides are characteristically deposited on the surface of the YBCO-based high temperature superconductor film as described above, which prevents a composition of the film from deviating from a stoichiometric composition.

Accordingly, the YBCO-based high temperature superconductor film is grown with a Cu composition near the surface of the film maintained higher with respect to a stoichiometric composition, whereby the YBCO-based high temperature superconductor film can have good film quality and can be substantially single crystal.

The YBCO-based high temperature superconductor film is patterned in required configurations to be used as, e.g., circuit patterns, etc. of superconducting filters. The Cu oxides which are deposited on the upper surface of the YBCO-based high temperature superconductor film make no special problem because high frequency signals tend to propagate along the side surface of a circuit pattern.

[A First Embodiment]

Figure 2A:
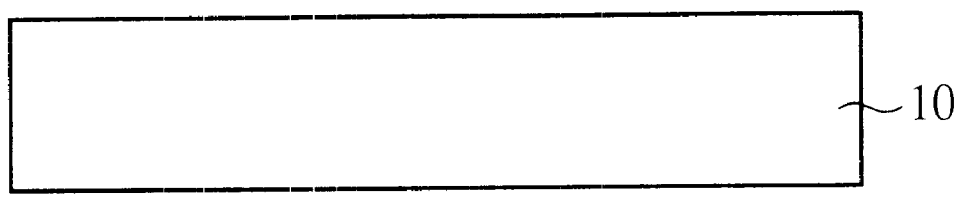
FIGS. 2A and 2B are sectional views of the YBCO-based high temperature superconductor film according to the first embodiment of the present invention, in the steps of the method for forming the same.
Figure 2B:
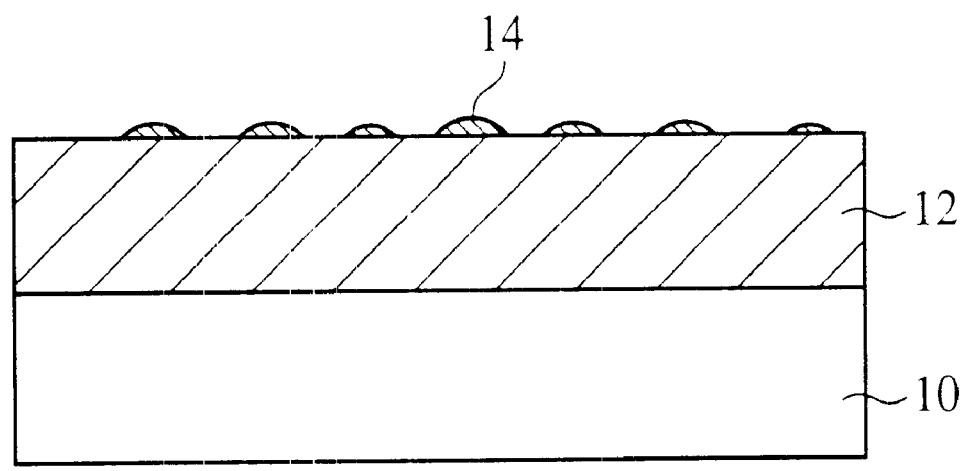

The YBCO-based high temperature superconductor film according to a first embodiment of the present invention and the method for fabricating the same will be explained with reference to FIGS. 1 to 2B. FIG. 1 is a sectional view of the YBCO-based high temperature superconductor film according to the present embodiment. FIGS. 2A and 2B are views of the YBCO-based high temperature superconductor film according to the present embodiment in the steps of the method for fabricating the same.

The YBCO-based high temperature superconductor film according to the present embodiment will be explained with reference to FIG. 1.

As shown in FIG. 1, a 0.9 $\mu$m-YBCO-based high temperature superconductor film 12, for example, is formed on a dielectric substrate 10 of, e.g., MgO single crystal. A composition of the part of the YBCO-based high temperature superconductor film 12 except for a vicinity of the surface thereof, i.e., the part except for a vicinity of the upper surface is substantially equal to $Y_1Ba_2Cu_3O_x$, which is a stoichiometric composition. A composition ratio of the Cu with respect to the Ba is substantially 1.5.

A thickness of the YBCO-based high temperature superconductor film 12 is 0.9 $\mu$m here but is not limited to 0.9 $\mu$m. When the YBCO-based high temperature superconductor film 12 is used as, e.g., a circuit pattern of a filter, a thickness of the YBCO-based high temperature superconductor film 12 is suitably set in a range of, e.g., 0.5 to 1.2 $\mu$m.

Near the surface of the YBCO-based high temperature superconductor film 12 a Cu composition is higher with respect to a stoichiometric composition (Y:Ba:Cu=1:2:3) of the YBCO-based high temperature superconductor. Specifically, near the surface of the YBCO-based high temperature superconductor film 12, a Cu composition with respect to a Ba composition is above, e.g., 1.51.

As will be described later, the YBCO-based high temperature superconductor film 12 is grown with a Cu composition of a vicinity of the surface of the film set above, e.g., 1.55 with respect to a Cu composition, whereby the Cu oxides can be easily produced while the yttrium oxides cannot be easily produced. Accordingly, with a Cu composition of a vicinity of the surface of the YBCO-based high temperature superconductor film 12 with respect to a Ba composition set above, e.g., 1.55, the YBCO-based high temperature superconductor film 12 can have better film quality.

A thickness of a part having a Cu composition made higher with respect to the stoichiometric composition of the YBCO-based high temperature superconductor is below, e.g., 30% of a film thickness of the YBCO-based high temperature superconductor film 12.

On the surface of the YBCO-based high temperature superconductor 12, a Cu oxide 14, such as CuO, $BaCuO_2$ or others, is deposited. A diameter of the Cu oxide 14 is, e.g., below 2 μm. A deposited amount of the Cu oxide 14 is, e.g., above $3 \times 10^7$ pieces/cm$^2$ per a 1 μm-film thickness.

The YBCO-based high temperature superconductor film according to the present embodiment is thus formed.

(Method for Forming the YBCO-Based High Temperature Superconductor Film)

Next, the method for forming the YBCO-based high temperature superconductor film according to the present embodiment will be explained with reference to FIGS. 2A and 2B. FIGS. 2A and 2B are sectional views of the YBCO-based high temperature superconductor film according to the present embodiment in the steps of the method for forming the same, which explain the method.

First, as shown in FIG. 2A, a dielectric substrate 10 of MgO single crystal is placed in a film forming chamber of, e.g., a pulsed laser deposition system. A plane of the dielectric substrate 10 for the YBCO-based high temperature superconductor film 12 to be formed on is, e.g., (100).

Then, as shown in FIG. 2B, the YBCO-based high temperature superconductor film 12 is grown on the entire surface of the dielectric substrate 10 by, e.g., pulsed laser deposition until the YBCO-based high temperature superocnductor film 12 has, e.g., a 0.9 μm. At this time, the YBCO-based high temperature superconductor 12 is grown with a Cu composition near the surface of the YBCO-based high temperature superconductor 12 set higher with respect to the soichiometric composition. For example, with a Cu composition near the surface of the film with respect to a Ba composition set to be above 1.51, the YBCO-based high temperature superconductor film 12 is grown. The YBCO-based high temperature superconductor film 12 is grown with a Cu composition near the surface of the film with respect to a Ba composition, whereby the Cu oxide 14 can be easily produced on the surface of the YBCO-based high temperature superconductor 12 while the production of the yttrium oxides can be depressed. The Cu oxide functions as a flux for advancing the crystal growth of the YBCO-based high temperature superconductor to suppress the generation of pores and crystal strains. The Cu oxide is characteristically deposited on the exterior of the film and do not reside in the film of the YBCO-based high temperature superconductor film. A composition of the part of the YBCO-based high temperature superconductor 12 except for a vicinity of the surface is the stoichiometric composition, $Y_1Ba_2Cu_3O_x$.

A target used in growing the YBCO-based high temperature superconductor film 12 is one having a Cu composition higher than the stoichiometric composition $Y_1Ba_2Cu_3O_x$ of the YBCO-based high temperature superconductor film 12. To be specific, a sintered target of, e.g., $Y_1Ba_2Cu_{3.6}O_x$ is used. The target having a Cu composition higher with respect to the stoichiometirc composition is used in growing the YBCO-based high temperature superconductor 12, whereby the Cu oxide can be easily produced on the surface of the YBCO-based high temperature superconductor 12 while the production of the yttrium oxides can be depressed.

A distance between the dielectric substrate 10 and the target is, e.g., 105 mm. A substrate temperature is, e.g., 700° C. To raise a substrate temperature to 700° C., a lamp heater, for example, is used to raise the substrate temperature to 700° C. at 60° C./min. An oxygen partial pressure in the film forming chamber is, e.g., 240 mTorr. As a laser for ablating the target, a KrF laser, for example, is used.

A growth rate for growing the YBCO-based high temperature superconductor film 12 is, e.g., 6 nm/min. However, a growth rate of the YBCO-based high temperature superconductor film 12 is not limited to 6 nm/min. The YBCO-based high temperature superconductor film 12 which has been grown at a relatively low growth rate tends to have good film quality. Preferably, a growth rate is suitably set to be below. e.g., 7 nm/min.

The YBCO-based high temperature superconductor film 12 is grown here with a Cu composition near the surface of the film with respect to a Ba composition set to be above 1.51. However, it is preferable that a Cu composition near the surface of the film with respect to a Ba composition is above, e.g., 1.55. The growth of the YBCO-based high temperature superconductor film 12 with a Cu composition near the surface of the film with respect to a Ba composition set to be, e.g., above 1.55 further advances the production of the Cu oxide 14 while depressing the production of the yttrium oxides, whereby a YBCO-based high temperature superconductor film 12 of higher film quality can be formed.

In forming the YBCO-based high temperature superconductor film 12, when a composition ratio of the Cu to the Ba near the surface of the film is not sufficiently high, often the production of the Cu oxide is not sufficiently advanced while the production of the yttrium oxides is not sufficiently depressed. In such case, pores can be generated inside the film, but even with the pores inside the film, diameters of the pores are below 0.05 μm, and even large diameters are below 0.1 μm. The pores are smaller than those generated in at least the conventional YBCO-based high temperature superconductor film.

Then, oxygen is fed until a pressure in the film forming chamber becomes, e.g., 200 Torr to cool the dielectric substrate 10.

Thus, the YBCO-based high temperature superconductor film is formed.

As described above, according to the present embodiment, the YBCO-based high temperature superconductor is formed with a Cu composition near the surface of the film set higher with respect to the stoichiometric composition, whereby the Cu oxide can be easily produced while the production of the yttrium oxides can be depressed. According to the present embodiment, the yttrium oxides cannot be easily produced, and accordingly pores and crystal strains are not easily generated, while the Cu oxide functions as a flux for advancing the crystal growth, whereby a YBCO-based high temperature superconductor film of good film quality and substantially single crystal can be formed.

(Evaluation Result)

Next, the evaluation result of the YBCO-based high temperature superconductor film according to the present embodiment will be explained with reference to TABLE 1.

TABLE 1

|  | Surface Deposition Amount ($10^7$ pieces/cm$^2$) | Crystal Grain Size ($\mu$m) | Surface Resistance Value ($\mu\Omega$) | Power Handling Capability |
|---|---|---|---|---|
| Control | 1.6 | 0.5 | 33 | $-6.35 \times 10^{-5}$ |
| Example | 3.2 | 3 | 19 | $-1.32 \times 10^{-5}$ |

(a) Surface Deposition Amount

First, surface deposition amounts, i.e., amounts of the Cu oxide deposited on the surfaces of YBCO-based high temperature superconductor films will be explained.

As shown in TABLE 1, in the Control, i.e., the conventional YBCO-based high temperature superconductor film, a number of the Cu oxide deposited on the surface was about $1.6 \times 10^7$ pieces/cm$^2$.

In the Example, i.e., the YBCO-based high temperature superconductor film according to the present embodiment, a number of the Cu oxide deposited on the surface was about $3.2 \times 10^7$ pieces/cm$^2$.

Based on this, it is seen that in the present embodiment, the number of the Cu oxide deposited on the film surface is larger in comparison with the conventional YBCO-based high temperature superconductor film.

(b) Crystal Grain Size

Then, sizes of the crystal grains, i.e., grain diameters of the crystals forming the YBCO-based high temperature superconductor film will be explained.

As shown in TABLE 1, in the Control, i.e., the conventional YBCO-based high temperature superconductor film, a grain diameter is about 0.5 $\mu$m.

In the Example, i.e., the YBCO-based high temperature superconductor film according to the present embodiment, a crystal grain size is about 3 $\mu$m.

Based on this, according to the present embodiment, a YBCO-based high temperature superconductor film of large crystal diameters and good film quality can be formed.

(c) Surface Resistance Value

Then, surface resistance values will be explained.

Figure 3:
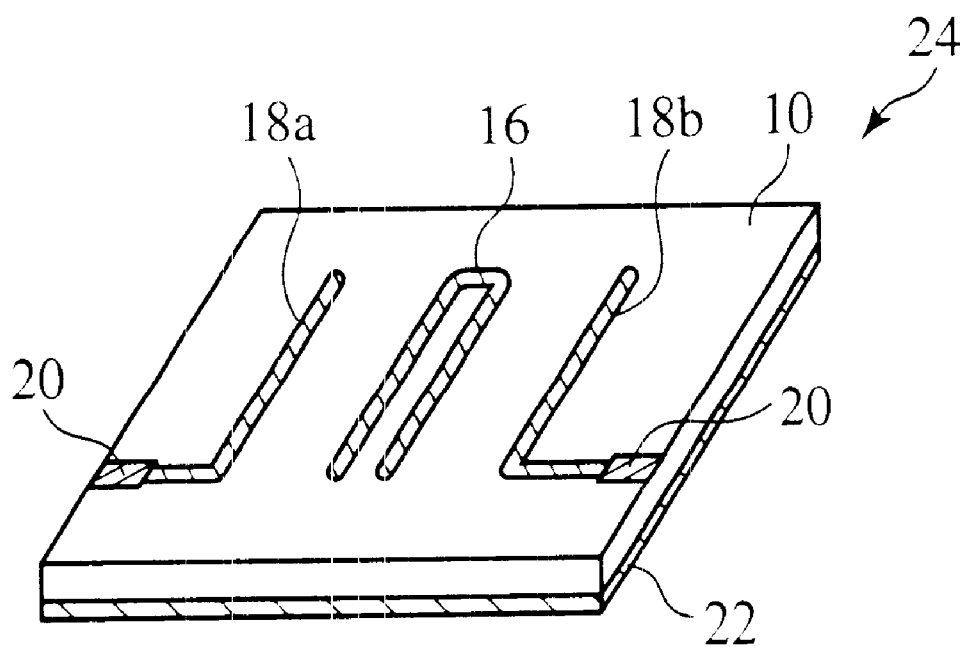
FIG. 3 is a perspective view of the superconductor resonator used in evaluating the YBCO-based high temperature superconductor film according to the first embodiment of the present invention.

First, a superconducting resonator used in the evaluating the surface resistance will be explained with reference to FIG. 3. FIG. 3 is a perspective view of the superconducting resonator used in the evaluation.

As shown in FIG. 3, a hair pin-shaped pattern 16 is formed of a YBCO-based high temperature superconductor film of a 0.9 $\mu$m-film thickness and a 0.5 mm-width on a 0.5 mm-film thickness dielectric substrate 10 of MgO single crystal. Feeder line patterns 18a, 18b are formed an oxide high temperature superconductor film of a 0.9 $\mu$m-film thickness and a 0.5 mm-width are formed on the dielectric substrate 10 on both sides of the hair pin-shaped pattern 16. Electrodes 20 are formed on the ends of the feeder line patterns 18a, 18b. A ground plane 22 of the YBCO-based high temperature superconductor film is formed on the underside of the dielectric substrate 10. The superconducting resonator 24 is thus formed.

Conditions for measuring values of the surface resistance were an about 2 GHz resonance frequency and a 70 K ambient temperature.

As shown in TABLE 1, in the Control, wherein, i.e., the hair pin-shaped pattern 16 and the feeder line patterns 18a, 18b of the superconducting resonator 24 are formed of the conventional YBCO-based high temperature superconducting film, a surface resistance value is about 33 $\mu\Omega$.

In the Example, wherein, i.e., the hair pin-shaped pattern 16 and the feeder line patterns 18a, 18b of the superconducting resonator 24 are formed of the YBCO-based high temperature superconducting film according to the present embodiment, a surface resistance value is about 19 $\mu\Omega$.

Based on this, it is seen that according to the present embodiment, a surface resistance value can be made small.

(d) Power Handling Capability

Then, the power handling capability will be explained.

Power handling capability means changes of high frequency characteristics made when an input power is increased and generally means deterioration of high frequency characteristics. In a resonator, resonance frequencies change. Lower power handling capability forms stable superconductor elements which are not influenced by changes of an input power.

Power handling capability is expressed by $(f_A - f_B)/f_B$ when a basic power is $-34.4$ dBm, a resonance frequency at the time that an input signal of the basic power is inputted to the superconducting resonator 24 is $f_B$, and a resonance frequency at the time when an input signal higher by 3.14 dBm than the basic power is inputted to the superconducting resonator 24 is $f_A$.

Conditions for measuring the power handling capability were an about 2 GHz resonance frequency and a 70 K ambient temperature, which were the same as those for measuring the surface resistance values.

As shown in TABLE 1, in the Control, wherein, i.e., the hair pin-shaped pattern 16 and the feeder lie patterns 18a, 18b of the superconducting resonator 24 are formed of the conventional YBCO-based high temperature superconducting film, power handling capability is about $-6.35 \times 10^{-5}$.

In the Example, wherein, i.e., the hair pin-shaped pattern 16 and the feeder lie patterns 18a, 18b of the superconducting resonator 24 are formed of the YBCO-based high temperature superconducting film according to the present embodiment, power handling capability is about $-1.32 \times 10^{-5}$.

Based on this, according to the present embodiment, a superconductor element of high power handling capability can be provided.

(e) Transmission Electron Microscopic Pictures

Then, transmission electron microscopic pictures of YBCO-based high temperature superconducting films will be explained with reference to FIG. 4.

Figure 4A:
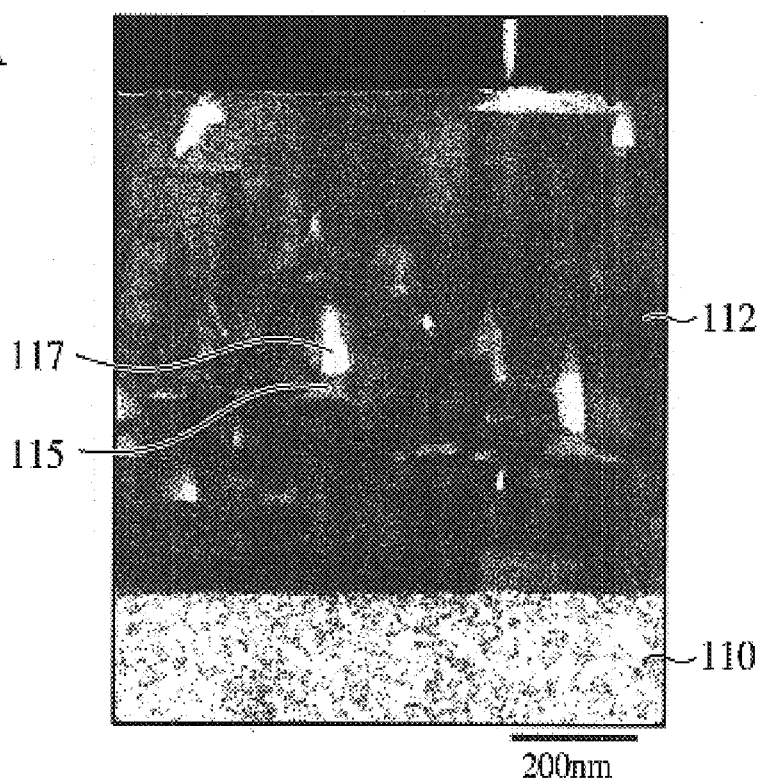
FIGS. 4A and 4B are a transmission electron microscopic pictures of sections of the YBCO-based high temperature superconductor films.
Figure 4B:
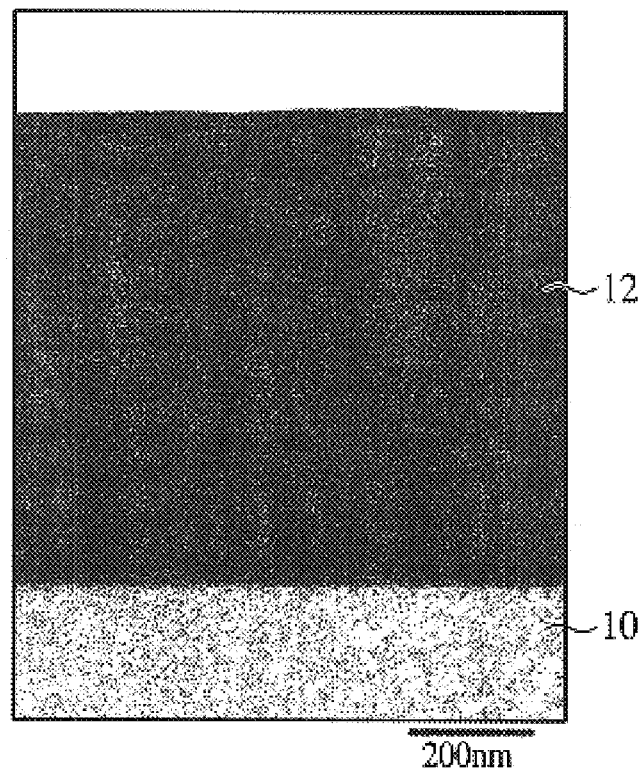

FIGS. 4A and 4B are transmission electron microscopic pictures of sections of the YBCO-based high temperature superconductor films. FIG. 4A is a transmission electron microscopic picture of the section of the conventional YBCO-based high temperature superconductor film. FIG. 4B is a transmission electron microscopic picture of the section of the YBCO-based high temperature superconducting film according to the present embodiment.

As shown in FIG. 4A, in the conventional YBCO-based high temperature superconductor film, the yttrium oxides 15 are produced, and pores 117 are generated near the yttrium oxides 115.

As shown in FIG. 4B, in the YBCO-based high temperature superconductor film according to the present embodiment, the yttrium oxides are not produced, and no pore is generated.

Based on this, according to the present embodiment, a YBCO-based high temperature superconductor film of very good film quality and substantially single crystal can be formed.

[A Second Embodiment]

Figure 5:
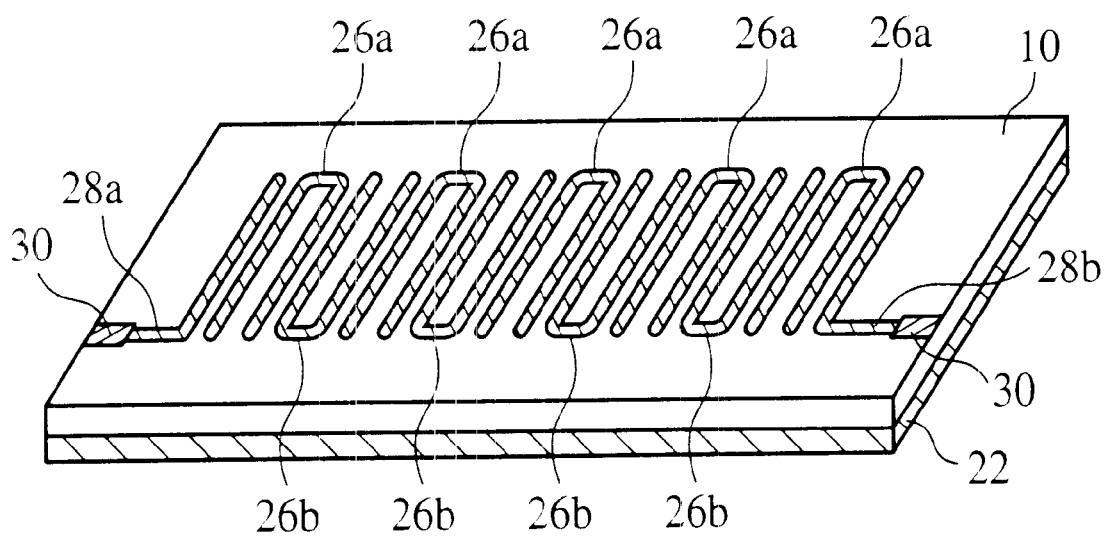
FIG. 5 is a perspective view of the superconductor element according to a second embodiment of the present invention.
Figure 6A:
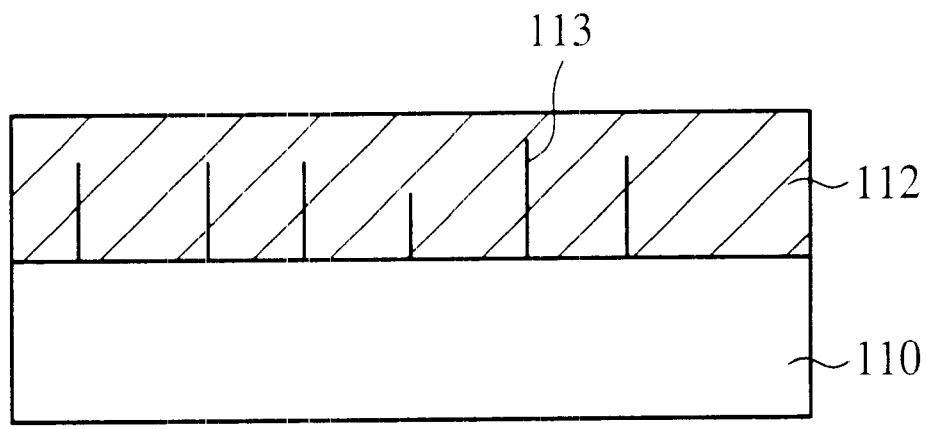
FIGS. 6A and 6B are sectional views of the conventional YBCO-based high temperature superconductor film.
Figure 6B:
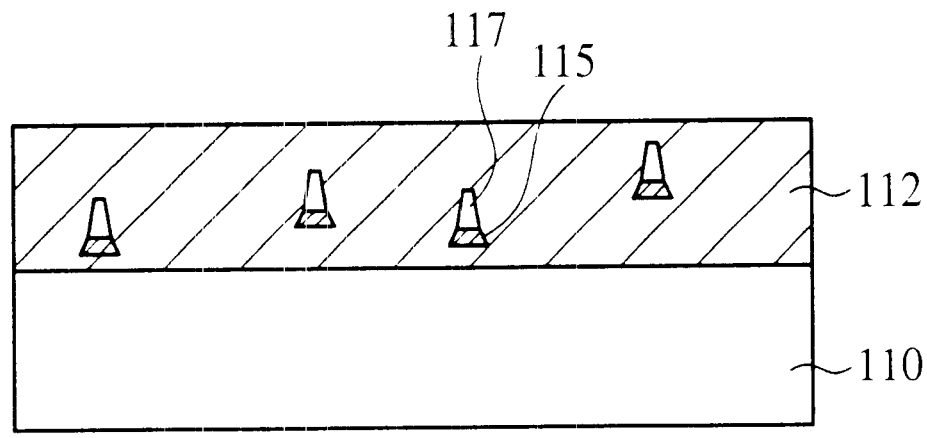

The superconductor element according to a second embodiment of the present invention will be explained with reference to FIG. 5. FIG. 5 is a perspective view of the superconductor element according to the present embodiment. The same members of the present embodiment as those of the high temperature superconductor film according to the first embodiment shown in FIGS. 1 to 4 and the method for forming the same are represented by the same members not to repeat or to simplify their explanation.

The superconductor element according to the present embodiment is mainly characterized in that the element is a superconductor filter using the YBCO-based high temperature superconductor film according to the first embodiment.

In the present embodiment, the present invention will be explained by means of a superconductor filter, but the YBCO-based high temperature conductor film according to the first embodiment can be used in all the superconductor elements, as of not only superconductor filters, but also superconductor resonators, superconductor antennas, etc.

As shown in FIG. 5, hair pin-shaped patterns 26a, 26b of a ½ wavelength which is formed of a YBCO-based high temperature superconductor film is formed on a dielectric substrate 10. The hair pin-shaped patterns 26a, 26b are arranged generally in one row. ¼ wavelength feeder line patterns 28a, 28b of the YBCO-based high temperature superconductor film are formed on the dielectric substrate 10 respectively on both sides of the hair pin-shaped patterns 26a, 26b.

The hair pin-shaped patterns 26a, 26b, and the feeder line patterns 28a, 28b are formed by patterning the YBCO-based high temperature superconductor film 12 according to the first embodiment by photolithography. The YBCO-shaped high temperature superconductor film 12 can be patterned by wet etching.

Electrodes 30 are formed respectively on the ends of the feeder line patterns 28a, 28b.

A grand plane 22 of the YBCO-based high temperature superconductor film is formed on the underside of the dielectric substrate 10.

The superconductor element according to the present embodiment is thus formed.

The superconductor element thus formed is mounted in a metal casing (not shown) and cooled by a cooling machine (not shown) to be used.

[Modifications]

The present invention is not limited to the above-described embodiments and can cover other various modifications.

For example, in the above-described embodiments, the dielectric substrate 10 is formed of MgO but is not essentially formed of MgO. For example, $LaAlO_3$ and sapphire may be used. In a case where sapphire is used as a material of the dielectric substrate, it is necessary that a buffer layer of $CeO_2$ or others is formed on the dielectric substrate of sapphire, and the YBCO-based high temperature superconductor film 12 is formed on the buffer layer.

In the second embodiment, the YBCO-based high temperature superconductor film according to the first embodiment is used to form the superconducting filter. As described above, the YBCO-based high temperature superconductor film is applicable not only to the superconducting filter, but also to all superconductor elements, such as superconductor resonators, superconductor antennas, etc.

In the above-described embodiment, the YBCO-based high temperature superconductor film 12 if grown by pulsed laser deposition. However, the YBCO-based high temperature superconductor film is not essentially grown by pulsed laser deposition and may be grown by any technique such as sputtering or others.

What is claimed is:

1. A high temperature superconductor film which is Y—Ba—Cu—O-based and formed on a dielectric substrate,
   a Cu composition ratio to the Ba near the upper surface of the film being higher than a composition Cu ratio to the Ba inside the film.

2. A high temperature superconductor film according to claim 1, wherein
   the Cu composition ratio to the Ba near the upper surface of the film is above 1.51.

3. A high temperature superconductor film according to claim 1, wherein
   a Cu composition ratio to the Ba near the upper surface of the film is above 1.55.

4. A high temperature superconductor film according to claim 1, wherein
   a Cu composition ratio to the Ba inside the film is substantially 1.5.

5. A high temperature superconductor film according to claim 1, wherein
   a Cu oxide is deposited on the upper surface.

6. A high temperature superconductor film according to claim 5, wherein
   the Cu oxide is CuO or $BaCuO_2$.

7. A high temperature superconductor film according to claim 1, wherein
   the Cu oxide has a diameter of below 2 μm.

8. A high temperature superconductor film according to claim 5, wherein
   a deposited amount of the Cu oxide is $3 \times 10^7$ pieces/cm² per a 1 μm-film thickness.

9. A high temperature superconductor film according to claim 1, wherein
   an average of crystal grain diameters is above 3 μm.

10. A high temperature superconductor film according to claim 1, wherein
    the high temperature superconductor film is substantially single crystal.

11. A high temperature superconductor film according to claim 1, wherein
    a diameter of a pore present inside the film is below 0.1 μm.

12. A high temperature superconductor film according to claim 1, wherein
    the dielectric substrate is formed of MgO, $LaAlO_3$ or sapphire.

13. A high temperature superconductor film according to claim 1, wherein
    a thickness of the film is 0.5 to 1.2 μm.

14. A high temperature superconductor film according to claim 1, wherein
    a thickness of a part where a Cu composition ratio to the Ba is higher than a Cu composition ratio to the Ba inside the film is below 30% of a film thickness.

15. A method for forming a high temperature superconductor film comprising the step of growing a Y—Ba—Cu—O-based high temperature superconductor film on a dielectric substrate,
    in the step of growing the high temperature superconducting film, the high temperature superconductor film is grown with a Cu composition ratio to the Ba near the upper surface of the film kept higher with respect to a Cu composition ratio to the Ba inside the film.

16. A method for forming a high temperature superconductor film according to claim 15, wherein in the step of growing the high temperature superconductor film, the high temperature superconductor film is grown with a Cu composition ratio to the Ba near the upper surface of the film set to be above 1.51.

17. A method for forming a high temperature superconductor film according to claim 15, wherein in the step of growing the high temperature superconductor film, the high temperature superconductor film is grown with a Cu composition ratio to the Ba near the upper surface of the film set to be above 1.55.

18. A method for forming a high temperature superconductor film according claim 15, wherein in the step for growing the high temperature superconductor film, the high temperature superconductor film is grown with a Cu composition ratio to the Ba inside the film set to be substantially 1.5.

19. A method for forming a high temperature superconductor film according to claim 15, wherein in the step of forming the high temperature superconductor film, the high temperature superconductor film is grown by evaporation or sputtering.

20. A method for forming a high temperature supercondutor film according to claim 15, wherein in the step of growing the high temperature superconductor film, the high temperature superconductor film is grown at a below 7 nm/min.

21. A superconductor element comprising a Y—Ba—Cu—O-based high temperature superconductor film, a Cu composition ratio to the Ba near the upper surface of the film is higher than a Cu composition ratio with respect to the Ba inside the film.

22. A superconductor element according to claim 21, wherein a Cu composition ratio to the Ba near the upper surface of the film is above 1.51.

23. A superconductor element according to claim 21, wherein a Cu composition ratio to the Ba near the upper surface of the film is above 1.55.

24. A superconductor element according to claim 21, wherein a diameter of a pore present inside the film is below 0.1 $\mu$m.

25. A superconductor element according to claim 21, wherein a diameter of a pore present inside the film is below 0.05 $\mu$m.

* * * * *